United States Patent

Yamamoto et al.

[11] Patent Number: 6,043,520
[45] Date of Patent: Mar. 28, 2000

[54] III-V HETEROJUNCTION BIPOLAR TRANSISTOR HAVING A GAAS EMITTER BALLAST

[75] Inventors: Yoshitsugu Yamamoto; Ryo Hattori, both of Tokyo, Japan

[73] Assignee: Mitsubishi Denki Kabushiki Kaisha, Tokyo, Japan

[21] Appl. No.: 09/156,652

[22] Filed: Sep. 18, 1998

[30] Foreign Application Priority Data

Apr. 2, 1998 [JP] Japan .................. P 10-089977

[51] Int. Cl.[7] .................................................. H01L 31/0328
[52] U.S. Cl. .................... 257/198; 257/197; 257/201; 257/565; 257/580; 257/582; 257/615
[58] Field of Search ............................. 257/197, 198, 257/580, 582, 201, 586, 565, 578, 615

[56] References Cited

U.S. PATENT DOCUMENTS

| 5,298,439 | 3/1994 | Liu et al. | 437/31 |
|---|---|---|---|
| 5,365,477 | 11/1994 | Cooper, Jr. et al. | 365/174 |
| 5,389,554 | 2/1995 | Liu et al. | 437/31 |
| 5,552,617 | 9/1996 | Hill et al. | 257/197 |
| 5,668,388 | 9/1997 | Delage et al. | 257/197 |
| 5,702,958 | 12/1997 | Liu et al. | 437/31 |
| 5,798,535 | 8/1998 | Huang et al. | 257/83 |
| 5,856,209 | 1/1999 | Imanishi | 438/47 |

FOREIGN PATENT DOCUMENTS

| 0630053 | 12/1994 | European Pat. Off. |
|---|---|---|
| 61-123176 | 8/1986 | Japan . |
| 3662039 | 6/1997 | Japan . |

OTHER PUBLICATIONS

Twynam et al., "Thermal Stabilization Of AlGaAs/GaAs Power HBTs using n–AL$_x$Ga$_{1-x}$As Emitter Ballast Resistors With High Thermal Coefficient of Resistance", Solid State Electronics, vol. 38, No. 9, 1995, pp. 1657–1661.

Primary Examiner—Jerome Jackson, Jr.
Assistant Examiner—Bradley William Baumeister
Attorney, Agent, or Firm—Leydig, Voit & Mayer, Ltd.

[57] ABSTRACT

A hetero-junction bipolar transistor having high reliability wherein a ballast resistance is exactly controlled and deterioration in current stability is eliminated. A GaAs ballast resistor layer is provided in a hetero-junction bipolar transistor having a GaAs emitter layer, an InGaP spacer layer, and a GaAs base layer, preventing a notch from being formed in the conduction band at the interface of the emitter layer and the ballast resistor layer, exactly controlling the ballast resistance. The AlGaAs layer is prevented from trapping impurities and the current stability is prevented from deteriorating.

7 Claims, 2 Drawing Sheets

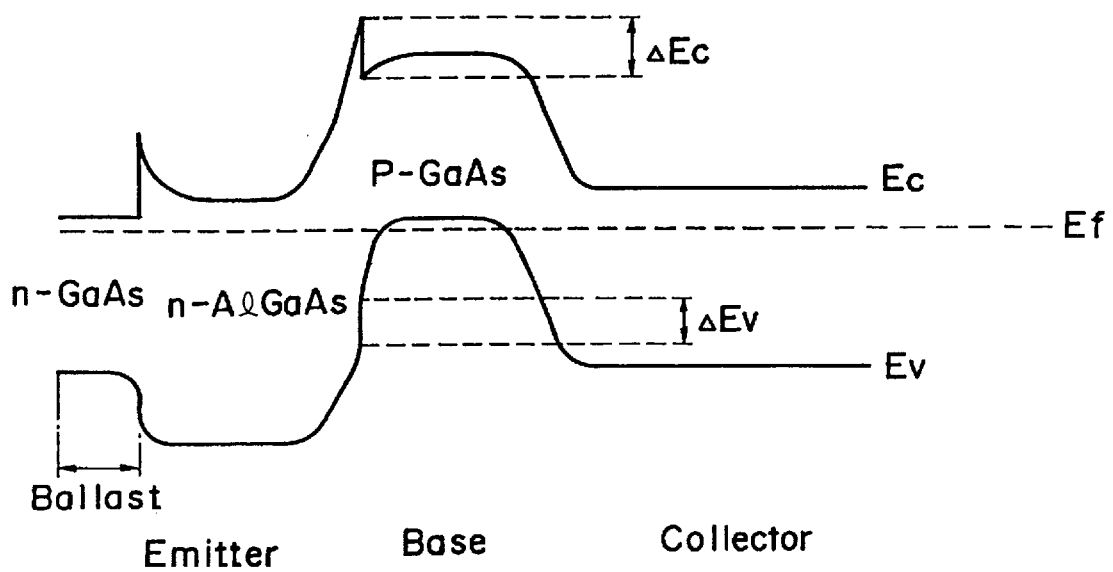

III-V HETEROJUNCTION BIPOLAR TRANSISTOR HAVING A GAAS EMITTER BALLAST

BACKGROUND OF THE INVENTION

1. Field of the Invention

The present invention relates to a hetero-junction bipolar transistor, more particularly to a high output hetero-junction bipolar transistor having a multi-finger structure.

2. Description of the Related Art

A hetero-junction bipolar transistor is capable of achieving a high current gain, β, and is therefore used in high-frequency, high-output devices. Hetero-junction bipolar transistors using an AlGaAs/GaAs material have been commercialized.

In a hetero-junction bipolar transistor, in order to prevent the collector current from increasing due to heat generation and to prevent current concentration in a particular transistor in a multi-finger type high-output transistor set including a plurality of transistors, a GaAs ballast resistor layer having a relatively high resistance is located between an emitter AlGaAs layer and an emitter electrode to decrease the voltage and prevent a steep increase from occurring in the collector current.

FIG. 3 is an energy band diagram of an AlGaAs/GaAs hetero-junction bipolar transistor of the prior art. In FIG. 3, an n$^-$-GaAs ballast resistor layer is provided between an n-AlGaAs emitter layer and an emitter electrode (not shown).

In the prior art hetero-junction bipolar transistor based on AlGaAs/GaAs, there has been a problem that the ballast resistance (resistance between the emitter layer and the emitter electrode) cannot be exactly controlled even when the concentration of impurities in the n$^-$-GaAs ballast resistor layer is exactly controlled.

According to the present inventors' knowledge, it is considered that the problem of the prior art described above occurs as the pinning level of the band changes due to the effect of impurities trapped in the AlGaAs layer in the hetero-junction between the ballast resistor layer and the adjacent AlGaAs layer, thus causing the relative position of the lower end of the conduction band, with respect to the Fermi level $E_F$, to change, depending on the quantity of impurities trapped.

That is, because the ballast resistor layer and the adjacent AlGaAs layer form a hetero-junction, a notch is formed at the lower end of the conduction band at the hetero-junction interface, as shown in FIG. 3, and the notch contributes to the increase in resistance. Thus it is supposed that, as the relative position of the lower end of the conduction band with respect to the Fermi level $E_F$ changes, the resistance due to the notch changes thereby making it impossible to exactly control the total ballast resistance even when the resistance of the ballast resistor layer is exactly controlled through precise control of the concentration of impurities in the ballast resistor layer and of the thickness of the ballast resistor layer.

In order to overcome this problem, the present inventors have studied a process of forming the ballast resistor layer from the same AlGaAs layer as the emitter layer. However, the AlGaAs layer is likely to trap impurities because of the Al component as described above. Such a constitution is also subject to a deterioration in current stability characteristics, that is, current changes significantly with time when a specified amount of current is supplied, supposedly due to the quality of the hetero-junction interface between the AlGaAs emitter layer and the GaAs base layer and the quality of the AlGaAs layer itself, thus resulting in deteriorating reliability of the device.

SUMMARY OF THE INVENTION

An object of the present invention is to provide a high-reliability hetero-junction bipolar transistor wherein the ballast resistance is precisely controlled for the prevention of deterioration in current stability.

The present inventors have intensively studied. As a result, it has been found that, when a GaAs ballast layer is provided in a hetero-junction bipolar transistor having a GaAs emitter layer, an InGaP spacer layer and a GaAs base layer, first a notch is not formed at the lower end of the conduction band in the interface between the emitter layer and the ballast resistor layer, thereby making it possible to exactly control the ballast resistance and, second, trapping of impurities into the AlGaAs layer can be prevented and deterioration of the current stability can be prevented. Thus, the present invention has been completed.

The present invention provides a hetero-junction bipolar transistor comprising at least a GaAs collector layer formed on a GaAs substrate, a GaAs base layer formed on the GaAs collector layer, a GaAs emitter layer formed on the GaAs base layer, an emitter electrode formed on the GaAs emitter layer and an InGaP spacer layer formed between the GaAs base layer and the GaAs emitter layer, wherein a ballast resistor layer made of GaAs is provided between the GaAs emitter layer and the emitter electrode.

When the emitter layer and the ballast resistor layer formed on the emitter layer are formed from the same GaAs layer as described above, the notch which has been formed at the end of the conduction band when the interface of both layers is turned into a hetero-junction interface of AlGaAs and GaAs is eliminated, thus preventing the resistance from being generated in that portion.

Consequently, it is made possible to exactly control the ballast resistance between the emitter layer and the emitter electrode by precisely controlling the resistance of the ballast resistor layer.

Also the use of the GaAs layer without Al component included therein for the emitter layer and the ballast resistor layer reduces the amount of impurities trapped during crystal growth and prevents the deterioration of the current stability supposedly caused by impurities, thereby making it possible to improve the reliability of the hetero-junction bipolar transistor.

It is preferable that low-resistance GaAs layers be stacked on both sides of the ballast resistor layer, to hold the ballast resistor layer therebetween.

This is because the value of the ballast resistor can be stabilized by providing the low-resistance ballast layer.

The concentration of impurities in the ballast resistor layer is preferably within the range from $1 \times 10^{16}$ to $5 \times 10^{16}$ cm$^{-3}$.

The concentration of impurities in the low-resistance GaAs layer is preferably within the range from $1 \times 10^{18}$ to $6 \times 10^{18}$ cm$^{-3}$.

The InGaP spacer layer is preferably formed of In$_x$Ga$_{1-x}$P ($0.45 \leq x \leq 0.55$).

This is because use of the InGaP spacer layer of such a composition improves the lattice matching with the GaAs base layer and others and prevents crystal defect from occurring.

The InGaP spacer layer is most preferably formed from In$_{0.5}$Ga$_{0.5}$P, in order to obtain good lattice matching with the GaAs layer.

In the hetero-junction bipolar transistor according to the present invention, as will be clear from the above description, because the emitter layer and the ballast resistor layer formed on the emitter layer are formed from the same GaAs layer, the notch which has been formed at the lower end of the conduction band in the interface of both layers of the prior art is eliminated, thus preventing the resistance from being generated in that portion, thereby making it possible to exactly control the ballast resistance.

Also because the emitter layer and the ballast resistor layer are formed from the GaAs layer, the amount of impurities trapped during crystal growth can be decreased, thereby preventing the deterioration of the current stability and making it possible to obtain the hetero-junction bipolar transistor having a high reliability.

BRIEF DESCRIPTION OF THE DRAWINGS

FIG. 3 is an energy band structure diagram of a prior art AlGaAs/GaAs hetero-junction bipolar transistor.

DESCRIPTION OF THE PREFERRED EMBODIMENTS

Now preferred embodiments of the present invention will be described below with reference to FIG. 1.

Figure 1:
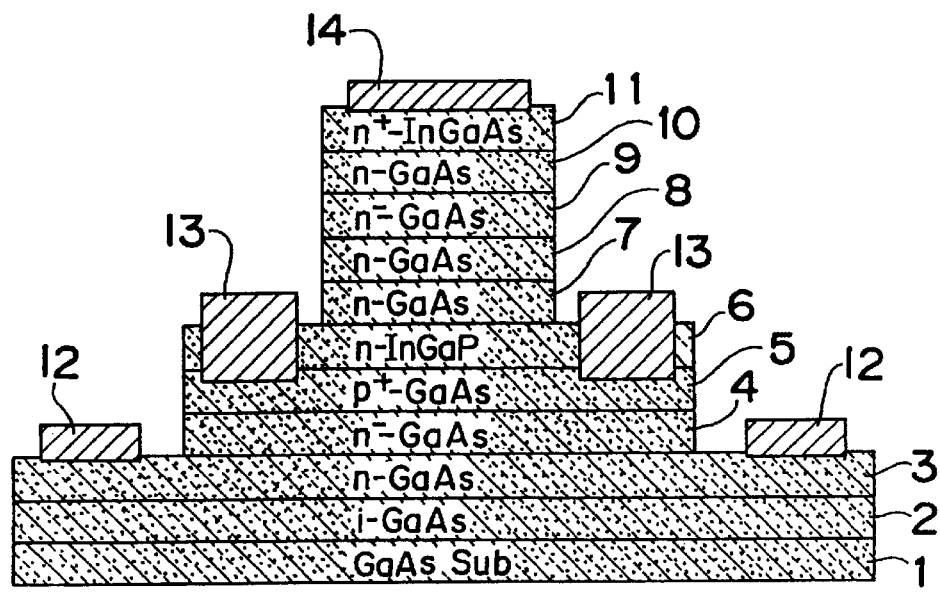
FIG. 1 is a cross sectional view of a hetero-junction bipolar transistor according to the present invention.

FIG. 1 is a cross sectional view of a hetero-junction bipolar transistor (HBT) according to this embodiment. In the drawing, numeral 1 denotes a semi-insulating GaAs substrate, 2 denotes an undoped GaAs or AlGaAs/GaAs super lattice structure or a buffer layer consisting of the former two structures, 3 denotes a GaAs sub-collector layer doped with n-type impurities to a high concentration, 4 denotes a GaAs collector layer including n-type impurities, 5 denotes a GaAs base layer doped with p-type impurities to a high concentration, 6 denotes an In$_{0.5}$Ga$_{0.5}$P spacer layer substantially of lattice matching with GaAs, 7 denotes a GaAs emitter layer doped with n-type impurities, 8 and 10 denote GaAs ballast resistance stabilizing layers doped with n-type impurities to a high concentration, 9 denotes a GaAs emitter ballast resistor layer doped with a small amount of n-type impurities, 11 denotes a n-type InGaAs contact layer, 12 denotes a collector electrode made of AuGe/Ni/Au, 13 denotes a base electrode made of Pt/Ti/Pt/Au and 14 denotes an emitter electrode made of WSi.

The buffer layer 2 is preferably provided so that there occurs less current leakage from an active layer formed thereon. Generally, an undoped GaAs layer, AlGaAs/GaAs super lattice structure or a structure consisting of the former two structures is employed.

For the sub-collector layer (collector contact layer) 3, a GaAs layer doped with n-type impurities in a high concentration (about 1 to $5 \times 10^{18}$ cm$^{-3}$) is used in order to obtain good ohmic connection with the collector layer. The thickness of the layer is preferably about 500 nm.

The collector layer 4 is formed on the sub-collector layer 3 and is doped with n-type impurities in a low concentration (about 3 to $5 \times 10^{16}$ cm$^{-3}$). The reason for doping with n-type impurities in a low concentration is for securing a sufficient withstanding voltage across the base and the collector, preferably about ten plus several volts. The thickness of the layer is preferably about 500 to 800 nm.

For the base layer 5, which is one of the most important layers controlling the characteristics of the bipolar transistor, a p-GaAs layer is used. The base layer 5 is preferably doped with impurities in a concentration of 1 to $4 \times 10^{19}$ cm$^{-3}$, and has a thickness of 50 to 100 nm.

The spacer layer 6 is a layer to be inserted between the base layer 5 and the emitter layer 7, and is an InGaP layer doped with n-type impurities in a concentration of about $5 \times 10^{17}$ cm$^{-3}$. The composition is preferably In$_x$Ga$_{1-x}$P ($0.45 \leq x \leq 0.55$) in order to substantially achieve lattice matching with the GaAs base layer 5. The most preferable composition is In$_{0.5}$Ga$_{0.5}$P, and the thickness is preferably from 30 to 50 nm.

The emitter layer 7 is GaAs doped with n-type impurities in a high concentration preferably about $3 \times 10^{17}$ cm$^{-3}$. The thickness of the layer is preferably from 100 to 150 nm.

The ballast resistance stabilizing layers 8 and 10 are disposed on opposite sides of the ballast resistor layer 9 in order to stabilize the resistance of the ballast resistor layer 9. The ballast resistance stabilizing layers 8 and 10 are GaAs doped with n-type impurities in a high concentration of preferably about $5 \times 10^{18}$ cm$^{-3}$. The thickness of the layers is preferably 30 nm.

A structure without the ballast resistance stabilizing layers 8 and 10 may also be employed.

The ballast resistor layer 9 is provided as an emitter ballast resistor between the emitter contact layer 11 and the emitter layer 7, and is GaAs doped with a small amount of n-type impurities. While the concentration of impurities in the ballast resistor layer 9 is desired to be low because it is used as a resistor to prevent current concentration, the concentration of impurities is preferably about $1 \times 10^{16}$ cm$^{-3}$ considering the capability of controlling the doping concentration during epitaxial crystal growth.

While the resistance of the ballast resistor layer 9 is determined by the concentration of impurities in the ballast resistor layer 9 and by its thickness, precise control of the ballast resistance can be more easily achieved by changing the thickness, considering the capability of controlling the doping concentration during epitaxial crystal growth.

In this embodiment, the concentration of impurities in the ballast resistor layer 9 is $1 \times 10^{16}$ cm$^{-3}$ and its thickness is 200 to 500 nm.

The emitter contact layer 11 is provided for achieving good ohmic contact with the emitter electrode 14, and is In$_{0.5}$Ga$_{0.5}$P layer doped with a high concentration of n-type impurities.

A hetero-junction is formed between the emitter contact layer 14 and the underlying GaAs layer 9, and a hetero-barrier is formed between the two layers. The barrier increases the resistance of the hetero-junction and leads to deterioration of the characteristics.

For this reason, a graded InGaAs connection layer (not shown) of In$_y$Ga$_{1-y}$As, with the value of y being continuously varied from 0 to 0.5, may be provided between the emitter contact layer 14 and the GaAs layer 9 located below. When the graded InGaAs connection layer is provided, apparent contact resistance decreases and the characteristics are improved.

The collector electrode 12 on the sub-collector layer 3 is AuGe/Ni/Au with thicknesses of preferably 60/15/300 nm, respectively.

The base electrode 13 on the base layer 5 is Pt/Ti/Pt/Au with thicknesses of preferably 30/30/30/350 nm, respectively.

Exposing the surface of the base layer 5 leads to problems such as an increase in the surface recombination current.

Therefore, after forming an emitter mesa through selective etching, with the emitter electrode 14 used as a mask and the InGaP spacer layer 6 as an etching stopper layer, and forming the base electrode 5 on the exposed InGaP spacer layer 6, Pt is diffused down to the base layer by sintering, keeping the base electrode 13 and the base layer 5 in contact with each other.

Because the InGaP spacer layer 6 is depleted, current does not flow between the base electrode 13 and the InGaP spacer layer 6.

The emitter electrode 14, on the emitter contact layer 11, is preferably WSi with a thickness of 40 nm.

Now the method of manufacturing the hetero-junction bipolar transistor according to this embodiment will be described below. The hetero-junction bipolar transistor is formed through epitaxial growth of the layers described above on a semi-insulating GaAs substrate.

The epitaxial growth may be organometallic vapor-phase deposition, molecular beam epitaxial deposition, gas source MBE, chemical beam expitaxy (CBE) or the like.

When doping the layers, Si, Te, Se or the like is used as the n-type dopant, and C, Be or the like is used as the p-type dopant.

The emitter mesa is preferably formed through selective self-aligned etching, using the WSi emitter electrode 14 as a mask.

Figure 2:
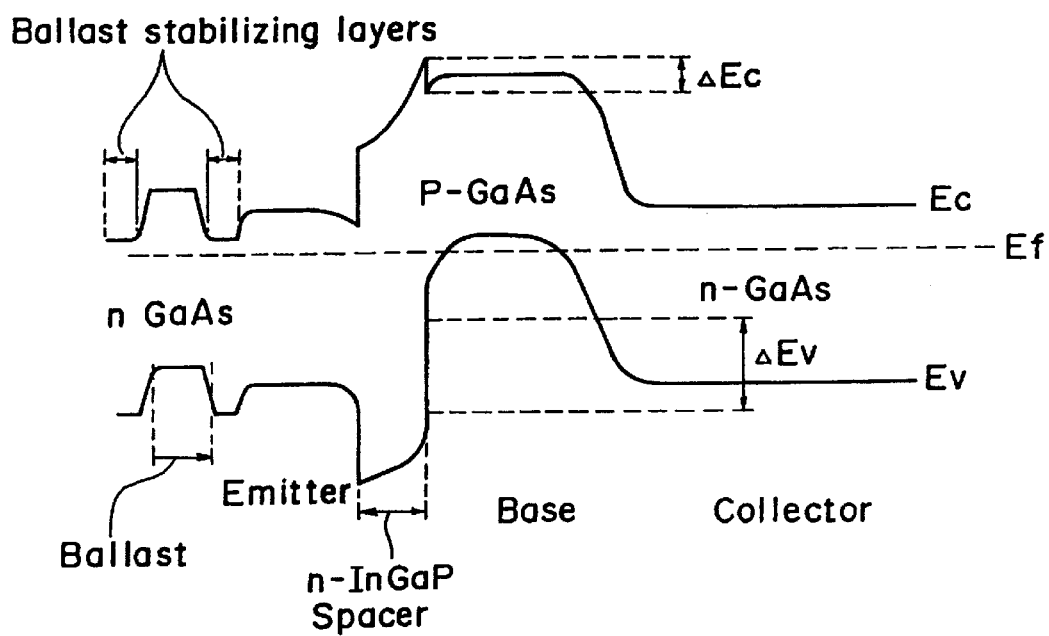
FIG. 2 is an energy band structure diagram of the InGaP/GaAs hetero-junction bipolar transistor according to the present invention.

FIG. 2 shows the energy band structure of the hetero-junction bipolar transistor, based on InGaP/GaAs, according to this embodiment.

In the hetero-junction bipolar transistor of this embodiment, as will be clear from FIG. 2, because the emitter layer and the ballast resistor layer are the same GaAs material, the notch which has been formed at the lower end of the conduction band in the hetero-junction interface of the emitter layer and the ballast resistor layer in the AlGaAs/GaAs hetero-junction bipolar transistor of the prior art shown in FIG. 3 is eliminated, thus preventing the resistance from being generated in that portion.

By precisely controlling the resistance of the ballast resistor layer with this configuration, it is possible to exactly control the resistance between the emitter layer and the emitter electrode and to improve the device characteristics.

Also, because the emitter layer and the ballast resistor layer are GaAs free of Al, the quantity of impurities trapped during crystal growth is decreased, preventing the deterioration of the current stability supposedly caused by such impurities and improving the reliability of the hetero-junction bipolar transistor.

In the hetero-junction bipolar transistor of this embodiment, the emitter/base junction is $In_{0.5}Ga_{0.5}P/GaAs$.

It has been reported that the recombination rate at the interface of $In_{0.5}Ga_{0.5}P/GaAs$ is about 210 cm/s, lower than the recombination rate at the interface of AlGaAs/GaAs by one order of magnitude (Appl. Phys. Lett. 55 (1989), pp1208).

Therefore, when the hetero-junction bipolar transistor includes the $In_{0.5}Ga_{0.5}P/GaAs$ hetero-junction, current gain β can be greatly improved to about 200 in the case of the $In_{0.5}Ga_{0.5}P/GaAs$ hetero-junction bipolar transistor of this embodiment, compared to about 100 in the case of the AlGaAs/GaAs hetero-junction bipolar transistor of the prior art.

What is claimed is:

1. A hetero-junction bipolar transistor comprising, successively disposed, a GaAs substrate, a GaAs collector layer, a GaAs base layer, an InGaP spacer layer, a GaAs emitter layer, a first GaAs layer, a GaAs ballast resistor layer contacting the first GaAs layer, a second GaAs layer contacting the GaAs ballast layer, and an emitter electrode, wherein the ballast resistor layer has a concentration of dopant impurities within a range from $1 \times 10^{16}$ to $5 \times 10^{16}$ $cm^{-3}$ and each of the first and second GaAs layers includes a concentration of dopant impurities within a range from $1 \times 10^{18}$ to $6 \times 10^{18}$ $cm^3$.

2. The hetero-junction bipolar transistor as claimed in claim 1, wherein the ballast resistor layer has a thickness from 200 to 500 nm.

3. The hetero-junction bipolar transistor as claimed in claim 1, wherein the first and second GaAs layers have thicknesses of about 30 nm.

4. The hetero-junction bipolar transistor as claimed in claim 1, wherein the InGaP spacer layer is $In_xGa_{1-x}P$ ($0.45 \leq x \leq 0.55$).

5. The hetero-junction bipolar transistor as claimed in claim 1, wherein the InGaP spacer layer is $In_{0.5}Ga_{0.5}P$.

6. The hetero-junction bipolar transistor as claimed in claim 5, wherein the the InGaP spacer layer has a thickness from 30 to 50 nm.

7. The hetero-junction bipolar transistor as claimed in claim 1, wherein no notch is formed in the conduction band between the emitter layer and the ballast resistor layer.

* * * * *